United States Patent [19]

Yamada et al.

[11] Patent Number: 5,276,334
[45] Date of Patent: Jan. 4, 1994

[54] CHARGED PARTICLE BEAM EXPOSURE METHOD AND APPARATUS

[75] Inventors: Akio Yamada; Kiichi Sakamoto; Kenichi Kawashima, all of Kawasaki, Japan

[73] Assignee: Fujitsu Limited, Kawasaki, Japan

[21] Appl. No.: 916,750

[22] Filed: Jul. 22, 1992

[30] Foreign Application Priority Data

Jul. 26, 1991 [JP] Japan .................... 3-187759

[51] Int. Cl.⁵ .......................... H01J 37/302
[52] U.S. Cl. .................. 250/492.2; 250/398
[58] Field of Search .......... 250/492.2, 492.22, 492.23, 250/398

[56] References Cited

U.S. PATENT DOCUMENTS

| | | | |
|---|---|---|---|
| 3,749,964 | 7/1973 | Hirata | 250/398 |
| 4,218,621 | 8/1980 | Nakasuji et al. | 250/492.2 |
| 4,492,870 | 1/1985 | de Chambost et al. | 250/398 |
| 4,560,878 | 12/1985 | Knauer et al. | 250/398 |
| 4,692,579 | 9/1987 | Saiton et al. | 250/492.2 |
| 4,818,885 | 4/1989 | Davis et al. | 250/398 |
| 4,870,286 | 9/1989 | Tobuse | 250/492.22 |
| 4,914,304 | 4/1990 | Koyama | 250/492.2 |
| 5,124,560 | 6/1992 | Fueki | 250/398 |
| 5,136,167 | 8/1992 | Langner et al. | 250/492.2 |
| 5,148,033 | 9/1992 | Yamada et al. | 250/398 |

OTHER PUBLICATIONS

"Recent Advances in Electron-Beam Lithography for the High-Volume Production of VLSI Devices", Pfeiffer, IEEE Transactions on Electron Devices, vol. ED-26, No. 4, Apr., 1979, pp. 663-674.
"Electron Optics for High Throughout Electron Beam Lithography System", Sohda et al., J. Vac. Sci. Technol. B 9 (6), Nov./Dec. 1991, pp. 2940-2943.

Primary Examiner—Constantine Hannaher
Assistant Examiner—Kiet T. Nguyen
Attorney, Agent, or Firm—Nikaido, Marmelstein, Murray & Oram

[57] ABSTRACT

A charged particle beam exposure method includes the steps of (a) selectively irradiating a charged particle beam on at least one selected opening forming a selected pattern of a mask which includes a plurality of openings related to a plurality of kinds of patterns so as to shape a cross section of the charged particle beam which is transmitted through the selected opening, where the area of the mask is divided into a plurality of blocks each including at least one opening which is related to one pattern, and (b) irradiating the charged particle beam which is transmitted through the selected opening of the mask onto an object surface so as to expose a desired pattern corresponding to at least a part of the pattern of the selected opening on the object surface, where the step (a) carries out first and second deflections independently of each other with respect to the charged particle beam. The first deflection deflects the charged particle beam within a first deflection range which corresponds to the size of one block and the second deflection deflects the charged particle beam within a second irradiating range which covers a plurality of blocks of the mask, so that the second deflection deflects the charged particle beam to irradiate the selected opening out of the plurality of openings of the mask and the first deflection sets the first deflection range of the charged particle beam with respect to the selected opening.

14 Claims, 8 Drawing Sheets

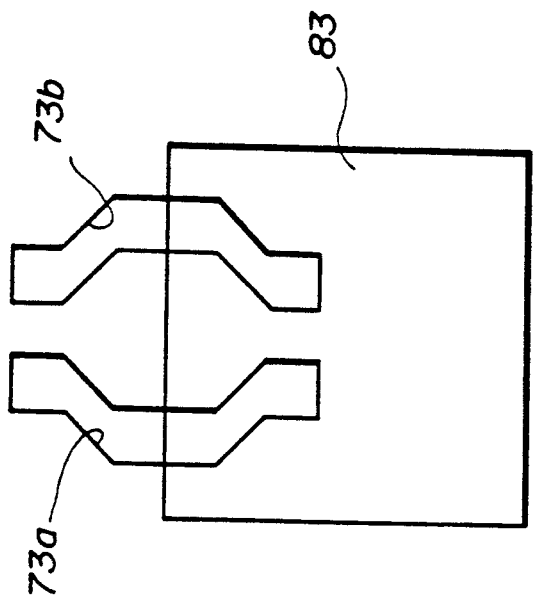
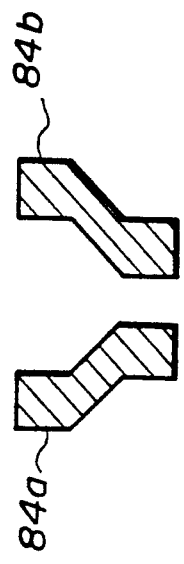
FIG. 4A
PRIOR ART
FIG. 4B
PRIOR ART

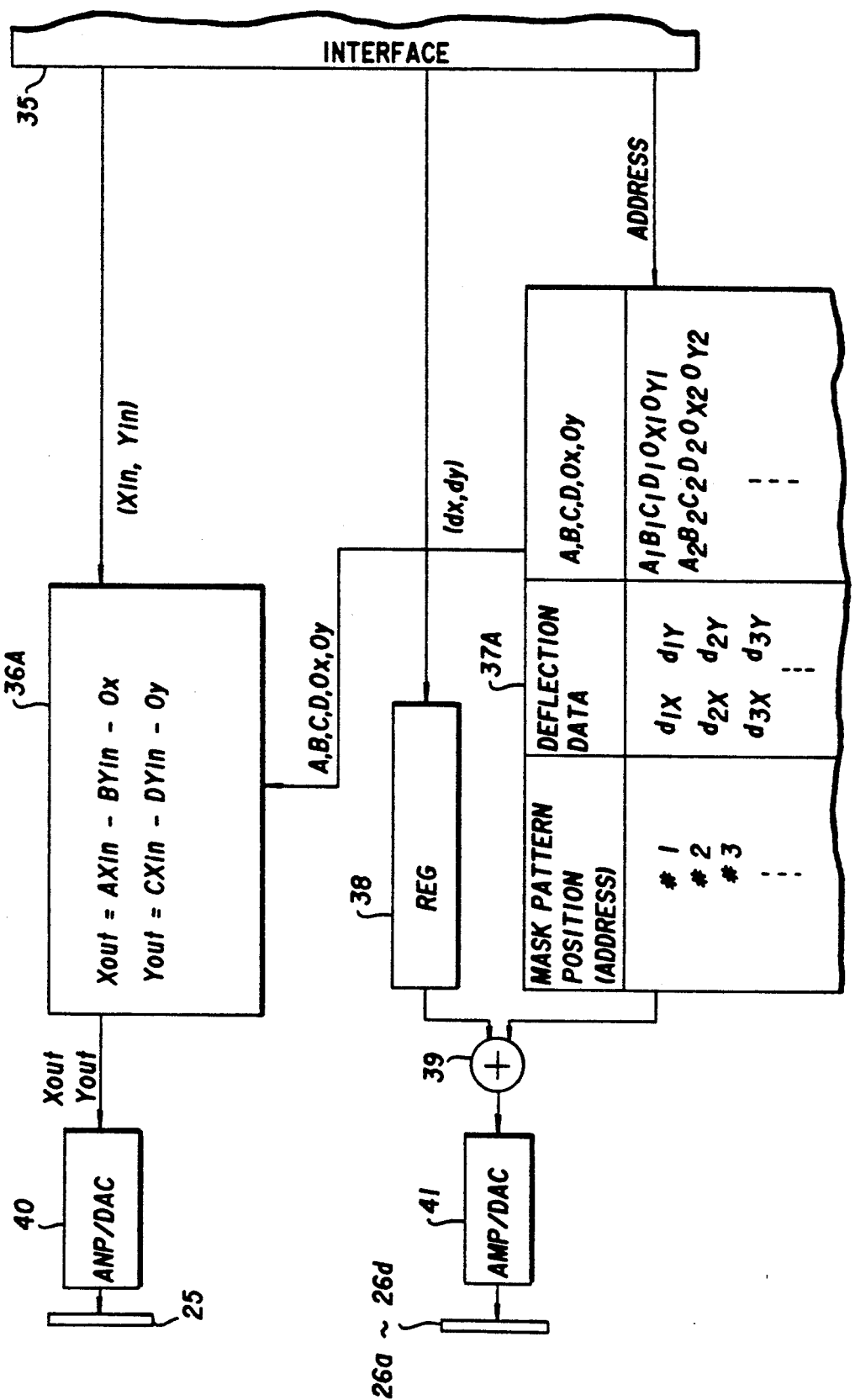

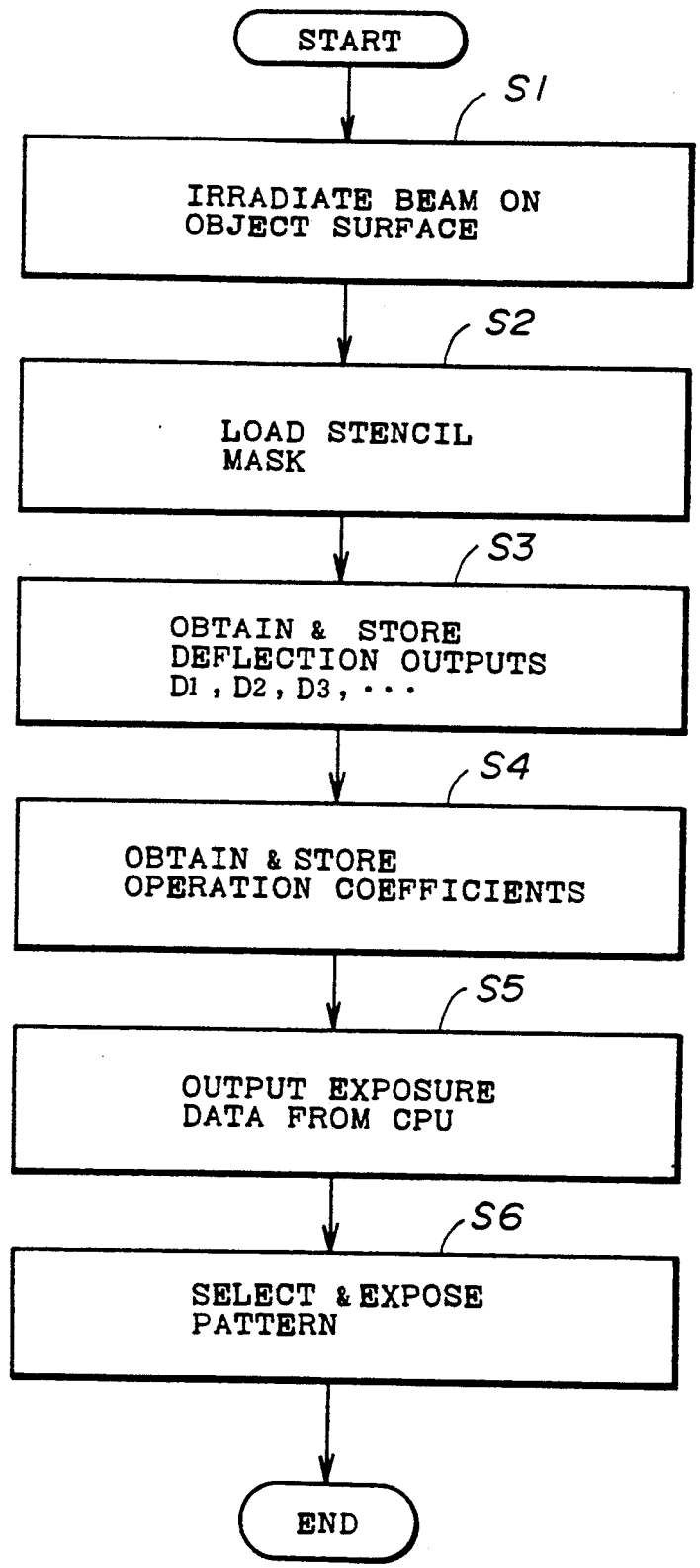

CHARGED PARTICLE BEAM EXPOSURE METHOD AND APPARATUS

BACKGROUND OF THE INVENTION

The present invention generally relates to charged particle beam exposure methods and apparatuses, and more particularly to a charged particle beam exposure method which exposes a basic pattern on an object by a single shot of a charged particle beam using a mask which is provided with an opening of the basic pattern which forms a unit of a repeating pattern and to a charged particle beam exposure apparatus which uses such a method.

Recently, due to the further increase in the integration density of large scale integrated circuits (LSIs), a new exposure apparatus which uses a charged particle beam such as an electron beam has been proposed to replace the photolithography technique which was popularly used over the years to expose fine patterns. The charged particle beam exposure apparatus scans the object by deflecting a charged particle beam which has a rectangular cross section which is variable, and draws a desired pattern on the object. The charged particle beam exposure apparatus is provided with a pattern generation function for forming a pattern from a pattern data. However, because the charged particle beam exposure apparatus draws the pattern by connecting rectangular shots of the charged particle beam, there was a problem in that the number of exposure shots per unit area generally increases as the pattern size becomes smaller, thereby reducing the throughput.

On the other hand, a semiconductor device which requires extremely fine patterns such as a 64-Mbit dynamic random access memory (DRAM) has extremely fine patterns but a majority of the area to be exposed include a repetition of basic patterns. For this reason, if the basic pattern which forms a unit of the repeating pattern can be generated by a single shot regardless of the complexity thereof, it becomes possible to carry out the exposure with a constant throughput independently of the fineness of the patterns.

Accordingly, in order to overcome the above described problem and realize a satisfactory throughput even when exposing the extremely fine patterns, the so-called block exposure method has been proposed. The block exposure method irradiates a transmission mask which includes the basic pattern by the charged particle beam so that the basic pattern is exposed in a single shot, and the exposed basic patterns are connected to form the repeating pattern. The transmission mask is also referred to as a block mask or a stencil mask.

In the charged particle beam exposure apparatus employing the block exposure method, a plurality of kinds of basic patterns are normally formed in the transmission mask in order to efficiently carry out the exposure. However, it is desirable that the number of kinds of patterns which can be exposed by use of the transmission mask is greater than the number of kinds of basic patterns formed in the transmission mask.

FIG. 1 generally shows an example of a conventional charged particle beam exposure apparatus which employs the block exposure method. This example uses an electron beam as the charged particle beam. For example, this conventional electron beam exposure apparatus is proposed in Hans C. Pfeiffer, "Recent Advances in Electron-Beam Lithography for the High-Volume Production of VLSI Devices", IEEE Transactions on Electron Devices, Vol.ED-26, No. 4, April 1979.

In FIG. 1, an electron beam emitted from an electron gun 51 passes through a rectangular opening of a shaping plate 52 and the cross sectional shape of the electron beam is shaped into a rectangular shape. Further, the electron beam is converged by an electron lens 53 and is deflected by a deflector 54a which is used to select a pattern, so that the electron beam passes through a desired pattern part of a stencil mask 55.

On the other hand, a central processing unit (CPU) 62 reads out a pattern data which is stored in a memory unit 66 and inputs the pattern data to an exposure controller 64 via a bus 63. The exposure controller 64 supplies to an amplifier and converter (AMP/DAC) 65 a block deflection data which is dependent on a basic pattern which is to be exposed from the pattern data. The AMP/DAC 65 is made up of an amplifier (AMP) and a digital-to-analog converter (DAC). The AMP/DAC 65 amplifies and converts the block deflection data into an analog deflection control signal which is supplied to the deflector 54a. Hence, the electron beam is deflected by the deflector 54a so as to irradiate the selected basic pattern. In addition, the deflection control signal also drives a deflector 54b which is used to select a pattern.

As a result, the cross sectional shape of the electron beam is shaped into the pattern of the stencil mask 55 and is returned to the same optical axis as the electron beam emitted from the electron lens 53 by the converging function of an electron lens 56 and the deflection function of the deflector 54b. The cross section of the electron beam is thereafter reduced by a reduction lens 57.

The electron beam transmitted through the reduction lens 57 reaches an electron lens 59 via a circular opening of a plate 58. The circular opening limits the electron beam so as to determine the optical axis. The electron lens 59 converges the electron beam and a projection lens 60 exposes the electron beam at a predetermined position on an object surface 61. A deflector (not shown) provided at the projection lens 60 deflects the electron beam so as to scan the exposure position on the object surface 61.

FIGS. 2A and 2B respectively show a plan view and a cross sectional view of the stencil mask 55. The stencil mask 55 is made up of plate made of a semiconductor such as silicon (Si), a metal or the like. The thickness of the stencil mask 55 is approximately 20 μm at a pattern forming part 71.

As shown in FIG. 2A, the pattern forming part 71 of the stencil mask 55 includes basic patterns 72, 73 and 74 which form units of the repeating patterns. The basic pattern 72 is made up of two openings 72a and 72b having the shape shown, and a blocking part 72c. The basic pattern 73 is made up of two openings 73a and 73b having the shape shown, and a blocking part 73c. In addition, the basic pattern 74 is made up of two openings 74a and 74b having the shape shown, and a blocking part 74c.

The stencil mask 55 further includes a rectangular opening 75 which is used to form a non-repeating pattern, as shown in FIG. 2A. This rectangular opening 75 is used to carry out the exposure by varying the irradiating position of the electron beam relative to the rectangular opening 75 to vary the cross sectional area of the shaped electron beam.

The basic patterns 72, 73 and 74 and the rectangular opening 75 are provided within a pattern forming region II which is smaller than a electron beam deflecting region I. The electron beam deflection region I is the region in which the electron beam can be deflected, and the pattern forming region II is the region in which a pattern can be exposed. At the time of the exposure, the electron beam is deflected to irradiate a selected pattern depending on the exposure pattern data, and the selected pattern is exposed on the object surface 61.

Actually, a plurality of pattern groups are provided within the electron beam deflecting region I of the stencil mask 55, where each pattern group is a collection of patterns such as the basic patterns 72 through 74 and the rectangular opening 75. For this reason, when selectively irradiating a single pattern within a different pattern group, the stencil mask 55 is moved so that this different pattern group falls within the electron beam deflecting region I.

Hence, although not shown in FIG. 1, the stencil mask 55 is placed on a movable stage and is moved in a vicinity of the optical axis of the electron optical system. In addition, the electron optical system from the electron gun 51 to the object surface 61 are provided within a vacuum column body, and in order to load the stencil mask 55 onto the stage without disturbing the vacuum state, a sub chamber (not shown) for use in mask loading is provided so that the column body and the sub chamber can be disengaged at a gate valve (not shown).

In the conventional electron beam exposure apparatus, one basic pattern made up of the openings 73a and 73b as shown in FIG. 3A is selected from the plurality of basic patterns of the stencil mask 55 and the electron beam irradiates an irradiating range 81 of the stencil mask 55 so as to expose this selected basic pattern. As a result, the basic pattern including patterns 82a and 82b shown in FIG. 3B is exposed on the object surface 61 by a single shot of the electron beam. It is thus possible to expose a repeating pattern which is made up of the basic patterns at a high speed by connecting such basic patterns.

Therefore, according to the conventional electron beam exposure apparatus, the variable rectangular pattern made by the rectangular opening 75 or any of the basic patterns provided in the stencil mask 55 may be generated by a single shot of the electron beam.

However, a part of the basic pattern may appear in a portion of the repeating pattern, particularly at an end portion of the repeating pattern. For this reason, it is desirable that parts 84a and 84b of the basic pattern can be exposed on the object surface 61 as shown in FIG. 4B by setting an irradiating range 83 at a position shifted relative to the stencil mask 55 which is provided with the openings 73a and 73b of the basic pattern as shown in FIG. 4A.

If the part of the basic pattern is frequently used, the pattern of this part itself may be provided as an independent basic pattern. However, if the part of the basic pattern is not used frequently, it is desirable not to provide this part itself as an independent basic pattern because the number of kinds of basic patterns to be provided in the stencil mask 55 would increase although the area of the stencil mask 55 is limited.

On the other hand, it is possible to expose only a part of the basic pattern by the variable rectangular pattern. But in this case, the number of shots would increase considerably and the exposure time would become extremely long.

Accordingly, when selectively carrying out the total exposure of the basic pattern as shown in FIG. 3A or the partial exposure of the basic pattern as shown in FIG. 4A in the conventional electron beam exposure apparatus, it is necessary to supply a first mask deflection data for selecting a certain basic pattern and a second mask deflection data for varying the irradiating range on the selected basic pattern to the same deflectors 54a and 54b. Basically, the first mask deflection data are discrete data. But while the first mask deflection data may vary in a large deflection range of 5 to 6 mm square by varying the least significant bit (LSB), the second mask deflection data needs to vary in a small deflection range of approximately 500 μm square, for example. For this reason, if the first and second mask deflection data are added to form a single deflection data, an unnecessarily complex digital operation must be carried out in the AMP/DAC 65. In addition, it is difficult to determine the deflection efficiency of the first and second mask deflection data with the same accuracy in relation to the ratio with respect to the total amount of deflection, because the first mask deflection data basically varies in the large range in large steps while the second mask deflection data basically varies in the small range in small steps.

SUMMARY OF THE INVENTION

Accordingly, it is a general object of the present invention to provide a novel and useful charged particle beam exposure method and apparatus in which the problems described above are eliminated.

Another and more specific object of the present invention is to provide a charged particle beam exposure method comprising the steps of (a) selectively irradiating a charged particle beam on at least one selected opening forming a selected pattern of a mask which includes a plurality of openings related to a plurality of kinds of patterns so as to shape a cross section of the charged particle beam which is transmitted through the selected opening, where the area of the mask is divided into a plurality of blocks each including at least one opening which is related to one pattern, and (b) irradiating the charged particle beam which is transmitted through the selected opening of the mask onto an object surface so as to expose a desired pattern corresponding to at least a part of the pattern of the selected opening on the object surface, where the step (a) carries out first and second deflections independently of each other with respect to the charged particle beam. The first deflection deflects the charged particle beam within a first deflection range which corresponds to the size of one block and the second deflection deflects the charged particle beam within a second irradiating range which covers a plurality of blocks of the mask, so that the second deflection deflects the charged particle beam to irradiate the selected opening out of the plurality of openings of the mask and the first deflection sets the first deflection range of the charged particle beam with respect to the selected opening. According to the charged particle beam exposure method of the present invention, it is possible to expose an arbitrary pattern on the object surface at a high speed and with a high accuracy.

Still another object of the present invention is to provide a charged particle beam exposure apparatus for exposing a desired pattern on an object surface by irradiating a charged particle beam on the object surface via at least a selected opening forming a selected pattern of a mask which includes a plurality of openings related to a plurality of kinds of patterns, where the area of the mask is divided into a plurality of blocks each including at least one opening which is related to one pattern, comprising a beam source for emitting a charged particle beam, first deflector means for carrying out a first deflection by deflecting the charged particle beam on at least a part of the selected opening of the mask within a first deflection range which corresponds to the size of one block based on first data, second deflector means for carrying out a second deflection by deflecting the charged particle beam on the mask within a second deflection range which covers a plurality of blocks of the mask based on second data, and control means for supplying the first and second data which are related to the selected pattern to the first and second deflector means so that the first and second deflections are carried out independently of each other. According to the charged particle beam exposure apparatus of the present invention, it is possible to expose only a part of the desired pattern on the object object. For this reason, it is possible to expose on the object surface any of the plurality of kinds of patterns provided on the mask and also parts of these patterns.

Other objects and further features of the present invention will be apparent from the following detailed description when read in conjunction with the accompanying drawings.

BRIEF DESCRIPTION OF THE DRAWINGS

FIGS. 4A and 4B respectively are a plan view showing a partial exposure of the basic pattern of the stencil mask and a pattern of a part of the basic pattern exposed on the object surface;

FIG. 7 is a system block diagram showing an embodiment of a partial irradiation operation circuit of a second embodiment of the charged particle beam exposure apparatus according to the present invention together with essential related parts of the apparatus; and FIG. 8 is a flow chart for explaining an embodiment of a charged particle beam exposure method according to the present invention.

DESCRIPTION OF THE PREFERRED EMBODIMENTS

First, a description will be given of the operating principle of the present invention, by referring to FIG. 5.

Figure 5:
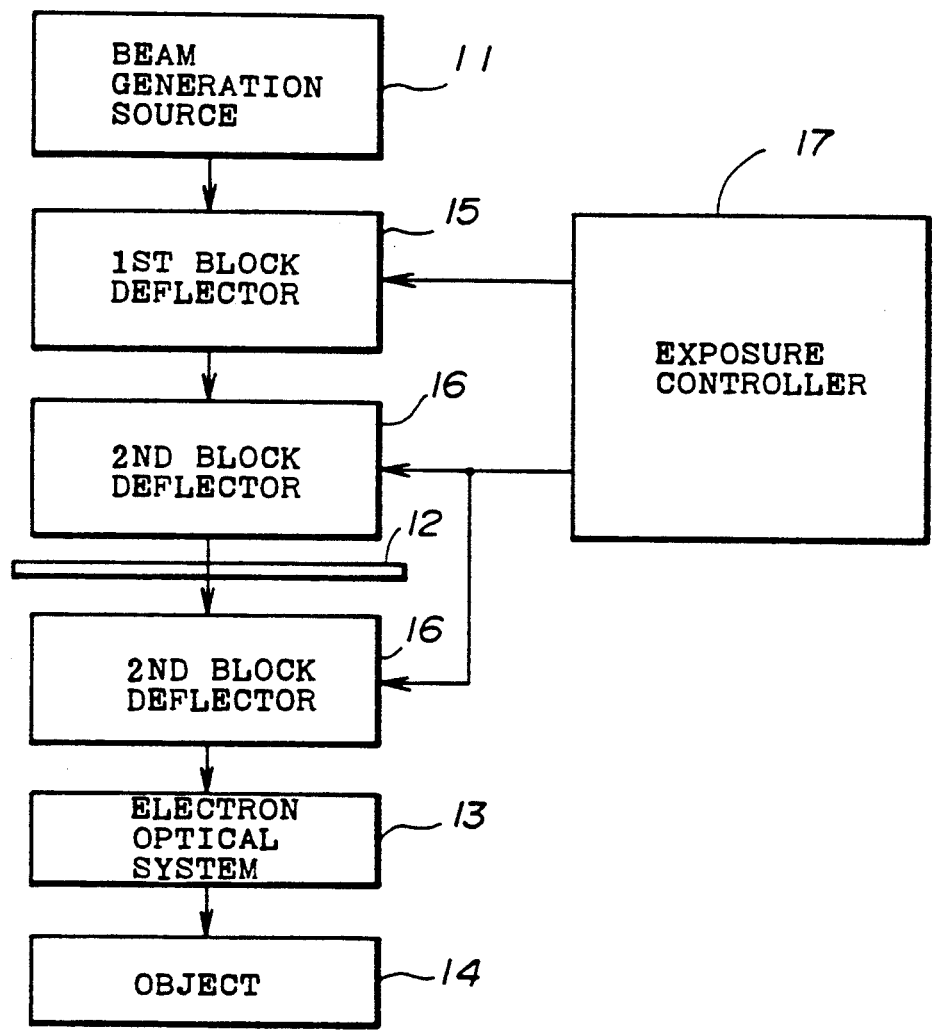
FIG. 5 is a system block diagram for explaining the operating principle of the present invention.

In FIG. 5, a mask 12 is provided with openings of a plurality of kinds of patterns. A charged particle beam from a charged particle beam generation source 11 of a charged particle beam exposure apparatus according to the present invention is deflected to selectively irradiate the opening of a selected pattern of the mask 12 out of the plurality of kinds of patterns. The charged particle beam transmitted through the mask 12 is passed through an electron optical system 13 which subjects the charged particle beam to processes such as reducing the size of the cross section of the charged particle beam and deflecting and projecting the charged particle beam so that the charged particle beam scans an object surface 14. The charged particle beam exposure apparatus is also provided with a first block deflector 15, second block deflectors 16 and an exposure controller 17.

The first block deflector 15 sets an irradiating range of the charged particle beam and deflects the charged particle beam with respect to the opening of a certain pattern of the mask 12. The second block deflectors 16 deflect the charged particle beam to selectively irradiate the opening of a selected pattern of the mask 12, and also returns the charged particle beam transmitted through the mask 12 back to an original optical axis.

The exposure controller 17 inputs to the first block deflector 15 a signal which is obtained by a digital operation. In addition, the exposure controller 17 inputs to the second block deflectors 16 a set value of the selected pattern out of set values which are set in advance with a 1:1 correspondence with respect to each of the patterns of the mask 12.

According to the charged particle beam exposure apparatus of the present invention, both the first and second block deflectors 15 and 16 are used to select the selected pattern of the mask 12 and to set the irradiating range of the charged particle beam on the selected pattern. For this reason, it is possible to set only a part of the selected pattern as the irradiating range of the charged particle beam.

For example, the exposure controller 17 may include a partial irradiation operation circuit and a memory. The partial irradiation operation circuit carries out a digital operation between a data which indicates the irradiating range of the charged particle beam with respect to the selected pattern and an operation coefficient. The memory prestores deflection output values to be applied to the second block deflectors 16 when irradiating the pattern by the charged particle beam, for each of the plurality of kinds of patterns. In this case, it is possible to continuously set the irradiating range of the charged particle beam with respect to the selected pattern by the first block deflector 15 based on the output of the partial irradiation operation circuit. In other words, the deflection range with respect to the selected pattern can be varied continuously. In addition, it is possible to discretely select the selected pattern of the mask 12 by the second block deflectors 16 based on the output value of the memory.

The operation coefficient may be set in advance at the time of making an electron beam adjustment depending on the deflection position of the charged particle beam due to the second block deflectors 16. In this case, the selected pattern is exposed as decided in its entirety or in part at the time of the exposure, because the operation coefficient is set in advance.

The deflection ranges of the first and second deflectors 15 and 16 may respectively correspond to the size of each individual pattern of the mask 12 and the size which totally covers a group of a plurality of kinds of patterns. In this case, it is possible to select an arbitrary pattern because the second block deflectors 16 have the deflection range which corresponds to the size of the plurality of kinds of patterns. In addition, it is possible to irradiate only a part of a pattern by the charged particle beam, since the first block deflector 15 has the deflection range which corresponds to the size of one pattern.

On the other hand, according to the charged particle beam exposure method of the present invention, the deflection of the charged particle beam to selectively irradiate a selected pattern out of the plurality of kinds of patterns of the mask 12 and the deflection of the charged particle beam to set the irradiating range of the charged particle beam with respect to the selected pattern are independently carried out by use of block deflectors exclusively provided therefor. Hence, it is possible to expose an arbitrary pattern on the object surface by setting only a part of the selected pattern as the irradiating range of the charged particle beam.

Figure 1:
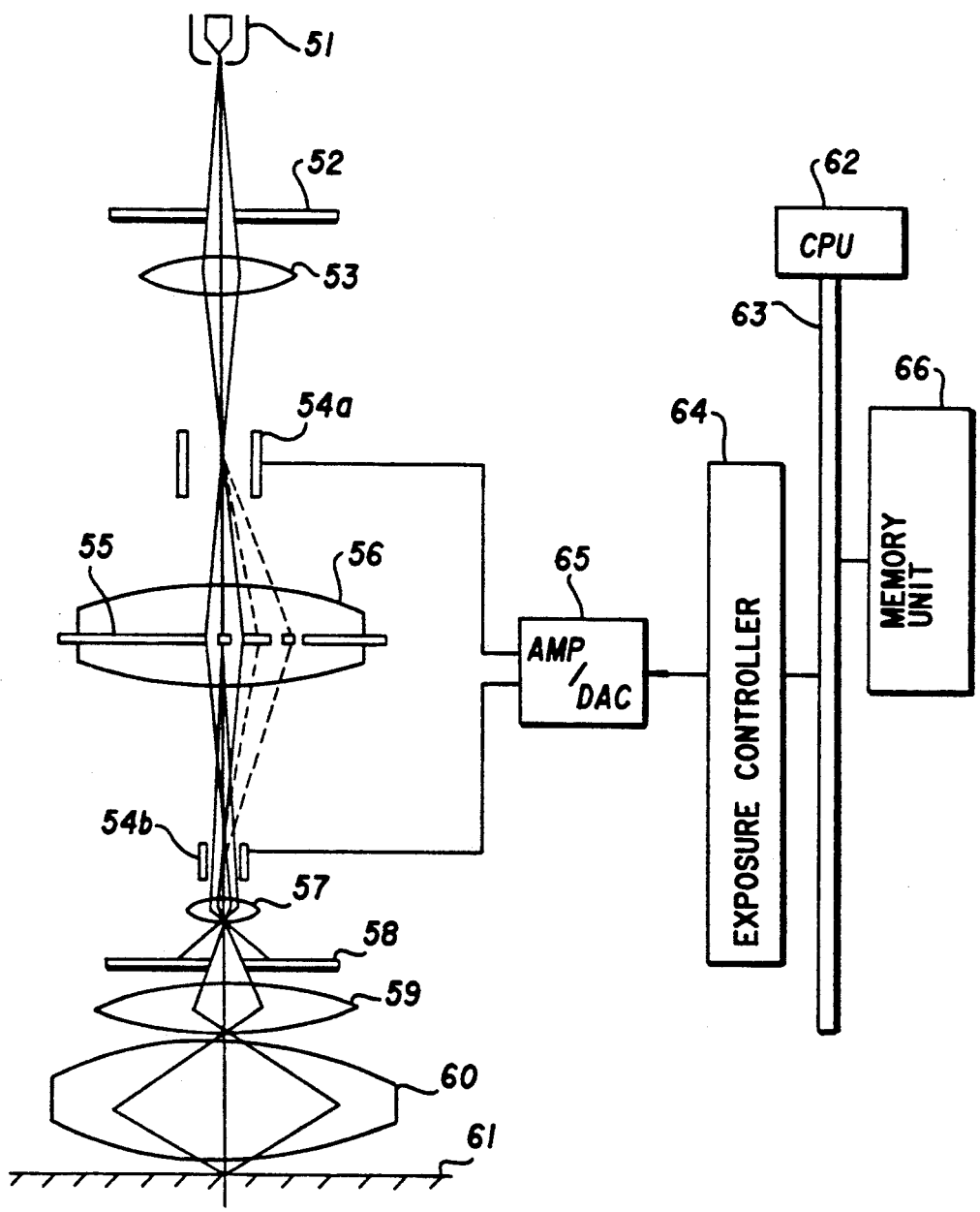
FIG. 1 is a diagram generally showing an example of a conventional charged particle beam exposure apparatus.
Figure 6:
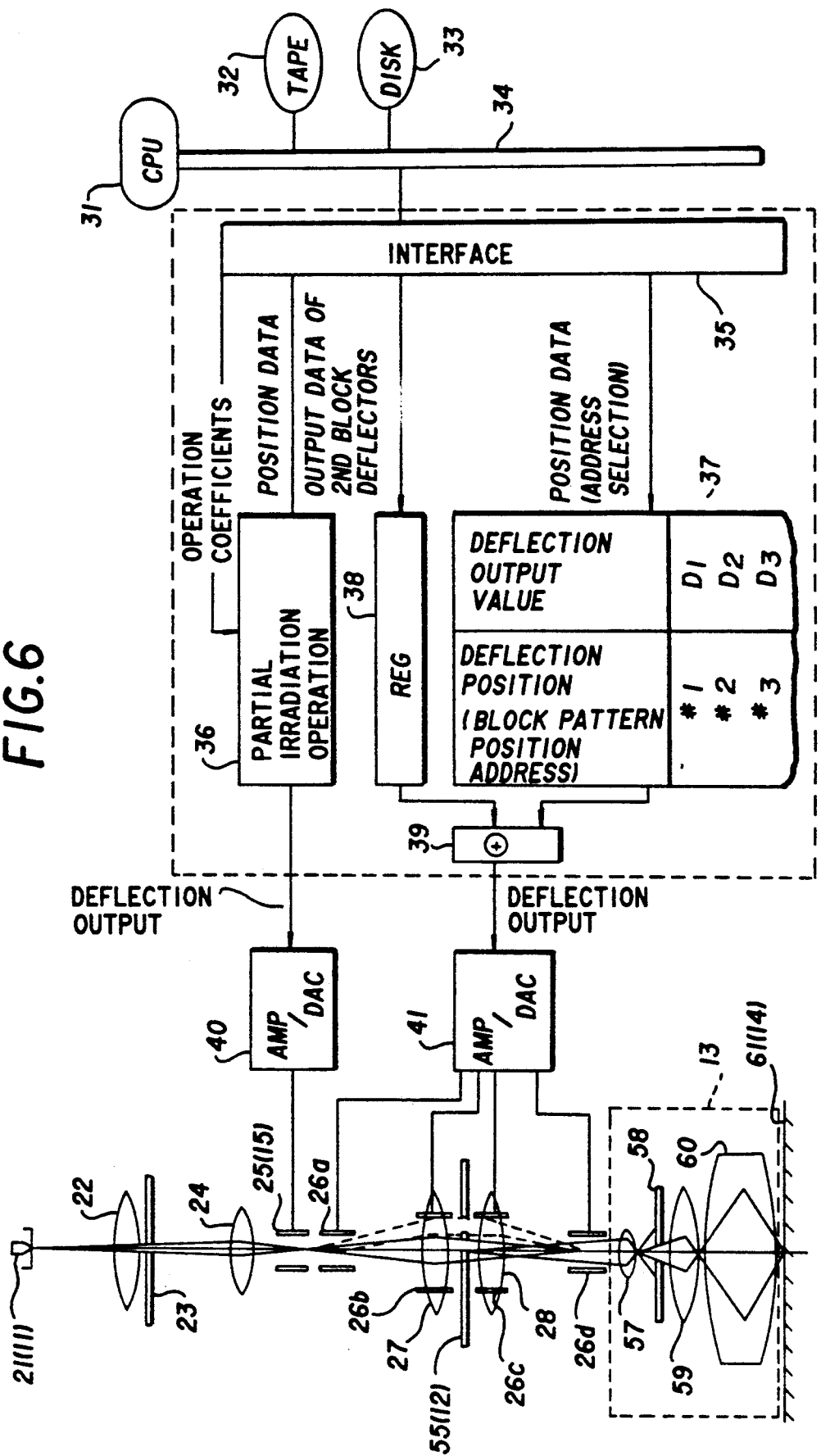
FIG. 6 is a diagram generally showing a first embodiment of a charged particle beam exposure apparatus according to the present invention.

Next, a description will be given of a first embodiment of the charged particle beam exposure apparatus according to the present invention, by referring to FIG. 6. In FIG. 6, those parts which are the same as those corresponding parts in FIGS. 1 and 5 are designated by the same reference numerals, and a description thereof will be omitted. In FIG. 6, the electron gun 21 forms the charged particle beam generation source 11 shown in FIG. 5 and emits an electron beam as an example of the charged particle beam.

In a direction in which the electron beam emitted from the electron gun 21 travels, there are provided the electron lens 22, the plate 23 having the rectangular opening, the electron lens 24, a first block deflector 25, second block deflectors 26a and 26b, the stencil mask 55, second block deflectors 26c and 26d, and the electron optical system 13 in this sequence. The second block deflectors 26b and 26c are respectively provided inside the electron lenses 27 and 28.

The first block deflector 25 is made up of an electrostatic deflector corresponding to the first block deflector 15 shown in FIG. 5 and having a deflection range of 500 μm square on the stencil mask 55, for example.

The second block deflectors 26a through 26d are made up of electrostatic deflectors corresponding to the second block deflectors 16 shown in FIG. 5 and respectively having a deflection range of 5 mm square on the stencil mask 55, for example. Out of the second block deflectors 26a through 26d, the second block deflectors 26a and 26b which are arranged on the electron beam input side of the stencil mask 55 deflect the electron beam from the optical axis of the electron beam which has transmitted through the electron lens 24 to irradiate the electron beam with a selected pattern of a pattern group of the stencil mask 55.

Figure 2A:
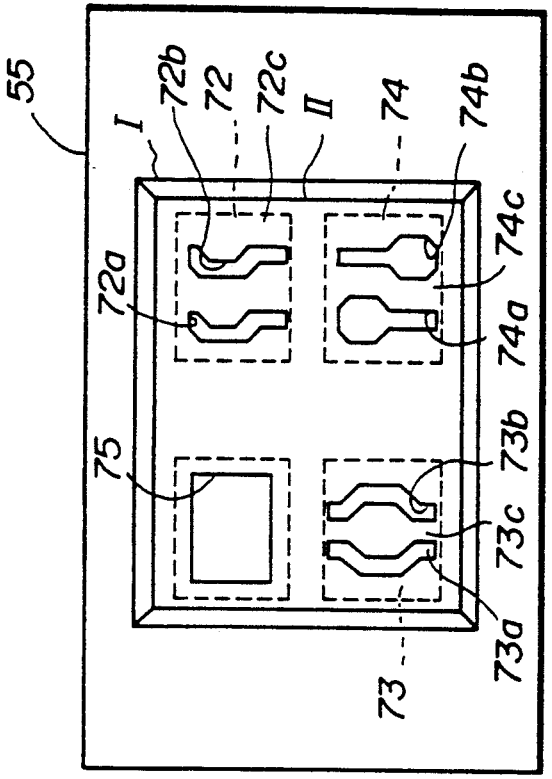
FIGS. 2A and 2B respectively are a plan view and a cross sectional view showing an example of a stencil mask.
Figure 2B:
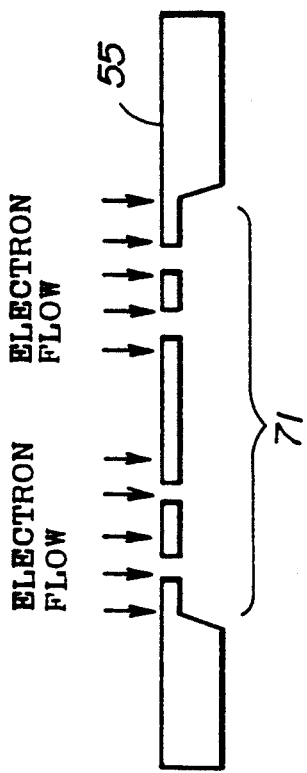

On the other hand, the second block deflectors 26c and 26d which are arranged on the electron beam output side of the stencil mask 55 deflect and return the electron beam which has transmitted through the stencil mask 55 back to the optical axis described above. The stencil mask 55 corresponds to the mask 12 shown in FIG. 5. As shown in FIG. 2A, the stencil mask 55 includes the openings of the three kinds of basic patterns 72 through 74 which are respectively provided in a region of 500 μm square, for example, and the rectangular opening 75 which is provided in a region of 500 μm square, for example. The basic patterns 72 through 74 and the rectangular opening 75 are arranged within the electron beam deflecting region I of 5 mm square, for example.

If it is assumed that the electron beam deflecting region I is 5 mm square, it is possible to arrange 10 patterns each provided in a region of 500 μm square in the vertical direction and 10 patterns each provided in a region of 500 μm square in the horizontal direction, that is, a total of 100 such patterns. However, only four patterns are arranged and shown in FIG. 2A for the sake of convenience.

A CPU 31, a magnetic tape unit 32 and a disk unit 33 are coupled to each other via a bus 34. The pattern data stored in the magnetic tape unit 32 and the disk unit 33 are input to the exposure controller 17 via the bus 34.

The exposure controller 17 includes an interface circuit 35, a partial irradiation operation circuit 36, a memory 37, a register 38 and an adder 39. The partial irradiation operation circuit 36 carries out a digital operation between a first block deflection position data which indicates the irradiating range (amount of error) of the electron beam with respect to the selected pattern and an operation coefficient. For example, the first block deflection position data is a 16-bit data.

The memory 37 prestores a 16-bit deflection output value, for example, which corresponds 1:1 to each pattern of the stencil mask 55. This 16-bit deflection output value is supplied to the second block deflectors 26a through 26d. The register 38 temporarily stores output data of the second block detectors 26a through 26d via the interface circuit 35. This register 38 is used for the data storage to the memory 37, and is not used at the time of the exposure. The adder 39 outputs the output value of the memory 37 or the register 38.

Both an amplifier and converter (AMP/DAC) 40 and an amplifier and converter (AMP/DAC) 41 amplify an input data and subjects the input data to a digital-to-analog conversion. An output driving voltage (deflection voltage) of the AMP/DAC 40 is supplied to the first block deflector 25, and output driving voltages (deflection voltages) of the AMP/DAC 41 are supplied to the second block deflectors 26a through 26d. Although the AMP/DAC 41 is shown in FIG. 6 as a single block, the AMP/DAC 41 actually includes four AMP/DACs, that is, one AMP/DAC for each of the second block deflectors 26a through 26d.

Next, a description will be given of the operation of this embodiment. The electron beam emitted from the electron gun 21 passes through the electron lens 22 and is formed into an electron beam having a rectangular cross section as it passes the rectangular opening of the plate 23. This electron beam having the rectangular cross section is converged by the electron lens 24. This electron beam from the electron lens 24 is deflected by the first block deflector 25 and the second block deflectors 26a and 26b and selectively irradiates a selected pattern of the stencil mask 55.

The cross sectional shape of the electron beam is formed into the selected pattern when the electron beam is transmitted through the stencil mask 55. This electron beam from the stencil mask 55 is deflected by the second block deflectors 26c and 26d so that the electron beam returns to the optical axis of the electron beam from the electron lens 24, and is thereafter input to the electron optical system 13. The electron optical system 13 has the same construction as the conventional electron optical system, and irradiates the electron beam at a desired position on the object surface 61.

On the other hand, the pattern data which is retrieved from the magnetic tape unit 32 or the disk unit 33 under the control of the CPU 31 is input to the interface circuit 35 via the bus 34. Since data (deflection output values) are initially not stored in the memory 37, an electron beam adjustment is first carried out to store the data in the memory 37.

That is, at the time of the electron beam adjustment, the CPU 31 writes into the register 38 the output data of the second block deflectors 26a through 26d for selecting one of the four kinds of patterns provided in the stencil mask 55. In this embodiment, the four kinds of patterns are made up of the basic patterns 72 through 74 and the rectangular opening 75. In addition, the CPU 31 inputs to the partial irradiation operation circuit 36 the position data of the first block deflector 25 and the operation coefficient. As a result, the output data of the second block deflectors 26a through 26d which are read from the register 38 are respectively applied to the second block deflectors 26a through 26d via the adder 39 and the AMP/DAC 41, so that the electron beam is deflected and irradiates the selected pattern or its vicinity of the stencil mask 55.

At the same time, an operation result which is obtained by the digital operation carried out in the partial irradiation operation circuit 36 is applied to the first block deflector 25 as the deflection voltage via the AMP/DAC 40, so as to determine the irradiating position of the electron beam with respect to the selected pattern.

Hence, a judgement is made to determine whether or not the electron beam which reaches the object surface 61 is the electron beam which has appropriately passed through the selected pattern of the stencil mask 55. If the desired pattern corresponding to the selected pattern of the stencil mask 55 is not obtained at the object surface 61, each of the data described above are changed and input to the register 38 and the partial irradiation operation circuit 36 so as to check the pattern of the electron beam on the object surface 61 obtained with the changed data.

The above described operation is repeated until the desired pattern corresponding to the selected pattern of the stencil mask 55 is obtained on the object surface 61. If the desired pattern corresponding to the selected pattern is obtained, the output data of the register 38 in this state is stored in the memory 37 as the deflection output values together with a pattern number (or pattern position address) which has been assigned to the selected pattern of the stencil mask 55. Furthermore, the operation coefficient is stored in a memory (not shown) within the CPU 31 or the like.

Figure 3A:
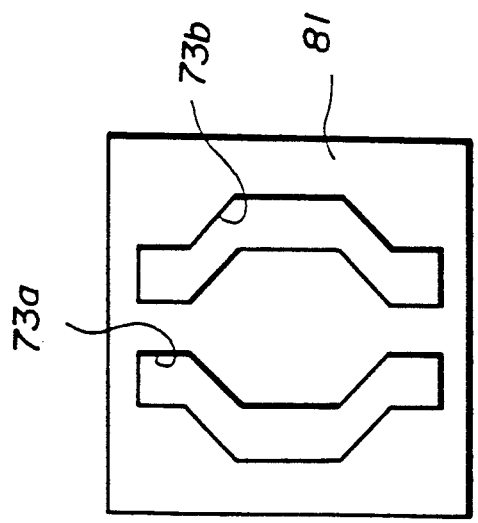
FIGS. 3A and 3B respectively are plan views showing total exposure of a basic pattern of the stencil and a pattern of the basic pattern exposed on an object surface.
Figure 3B:
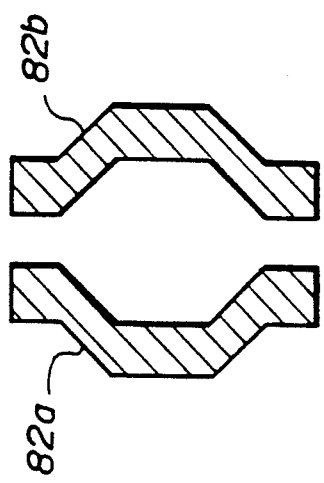

By repeating operations similar to that described above, the deflection output values and the pattern numbers which correspond 1:1 to all of the patterns of the stencil mask 55 are successively stored in the memory 37. In addition, the operation coefficients are successively stored in the memory within the CPU 31 or the like. Furthermore, the operation coefficients are not only obtained for the total exposure shown in FIG. 3A, but is also obtained similarly for the partial exposure shown in FIG. 4A with respect to the required part of the basic pattern, and these operation coefficients are stored in the memory within the CPU 31 or the like.

When the electron beam adjustment described above ends, the CPU 31 clears the contents of the register 38 and retrieves the pattern data related to the pattern which is to be exposed from the magnetic tape unit 32 or the disk unit 33. The retrieved pattern data is supplied to the partial irradiation operation circuit 36 and the memory 37 via the bus 34 and the interface circuit 35.

The pattern number of the selected pattern of the stencil mask 55 is applied to the memory 37 as the address, and thus, the deflection output values corresponding to the selected pattern are read out from the memory 37.

The deflection output values are supplied to the AMP/DAC 41 via the adder 39 and are subjected to amplification and digital-to-analog conversion before being applied to the respective second block deflectors 26a through 26d as the deflection voltages. Hence, the electron beam is deflected by the second block deflectors 26a through 26d which have the large deflection range covering the pattern group made up of the predetermined number of patterns of the stencil mask 55, so as to irradiate one selected pattern of the stencil mask 55.

At the same time, the partial irradiation operation circuit 36 receives the position data of the first block deflector 25 indicative of the amount of error (including the case of the total exposure when the amount of error is zero) and the operation coefficient which is required to obtain the deflection voltage for deflecting the electron beam by the first block deflector 25 taking into consideration the amount of error, and carries out the digital operation thereon.

The result of the digital operation obtained by the partial irradiation operation circuit 36 is supplied to the AMP/DAC 40 wherein amplification and digital-to-analog conversion are made to form an analog control voltage. This analog control voltage is applied to the first block deflector 25 which has the small deflection range corresponding to the size of one pattern of the stencil mask 55.

As a result, the electron beam which is transmitted through the electron lens 24 is deflected on the stencil mask 55 by the first block deflector 25 so that the irradiating range shifts by an amount which corresponds to the amount of error. Therefore, it is possible to expose only a part of the basic pattern as in the case shown in FIG. 4A, for example.

According to this embodiment of the apparatus, the patterns are discretely arranged in the stencil mask 55. Hence, by discretely storing the deflection output values in the memory 37 and reading out the deflection output values therefrom, it is possible to irradiate the electron beam on the selected pattern of the stencil mask 55 with a relatively rough precision but at a high speed.

On the other hand, the setting of the irradiating range of the electron beam on the selected pattern of the stencil mask 55 can be made with a high precision and the irradiating range may be varied continuously by determining the operation coefficients. As a result, the pattern of the stencil mask 55 is in effect selected at a high speed with a high precision. In addition, the digital operation is relatively simple and unnecessary operations are avoided in this embodiment, because the digital operation in the partial irradiation operation circuit 36 is carried out only with respect t the data which is used to finely deflect the electron beam within the small deflection range.

Next, a description will be given of an embodiment of a partial irradiation operation circuit of a second embodiment of the charged particle beam exposure apparatus according to the present invention, by referring to FIG. 7. FIG. 7 shows a partial irradiation operation circuit 36A together with essential related parts of the charged particle beam exposure apparatus. In FIG. 7, those parts which are the same as those corresponding parts in FIG. 6 are designated by the same reference numerals, and a description thereof will be omitted. This second embodiment of the apparatus basically differs from the first embodiment of the apparatus shown in FIG. 6 in that the operation coefficients are not stored in the memory within the CPU 31 but in a memory 37A. Hence, the operation coefficients are supplied directly from the memory 37A to the partial irradiation operation circuit 36A rather than via the interface circuit 35.

For example, the partial irradiation operation circuit 36A receives a data $(X_{in}, Y_{in})$ related to a partial irradiating range, where X and Y denote coordinate values in an X-Y coordinate system. This data $(X_{in}, Y_{in})$ indicates the irradiating range of each block pattern of the stencil mask 55. The block pattern corresponds to one of the basic patterns 72 through 74 and the rectangular opening 75 provided within a block region indicated by a dotted line in FIG. 2A.

In other words, the area of the stencil mask 55 is divided into a plurality of blocks indicated by the dotted lines in FIG. 2A, where each block includes one pattern which is made up of at least one opening. Hence, when totally irradiating a selected basic pattern, for example, the area of the stencil mask 55 irradiated by the electron beam is approximately the same as the area of the block which contains the selected basic pattern.

The partial irradiation operation circuit 36A calculates a deflection output $(X_{out}, Y_{out})$ which drives the first block deflector 25 based on the following formulas, where A, B, C, D, $O_x$ and $O_y$ denote the operation coefficients.

$$X_{out} = AX_{in} + BY_{in} + O_x$$

$$Y_{out} = CX_{in} + DY_{in} + O_y$$

In the above formulas, the terms $AX_{in}$, $BY_{in}$, $CX_{in}$ and $DY_{in}$ are data corresponding to the partial irradiating range. The operation coefficients A, B, C, D, $O_x$ and $O_y$ are read out from the memory 37A.

The operation coefficients A, B, C, D, $O_x$ and $O_y$ are obtained in advance for each of the block patterns of the stencil mask 55 and prestored in the memory 37A together with the corresponding deflection output values. FIG. 7 only shows a part of the prestored contents of the memory 37, and for example, deflection data $(d_{1x}, d_{1y})$ and operation coefficients $A_1$, $B_1$, $C_1$, $D_1$, $O_{x1}$ and $O_{y1}$ are prestored at a pattern position address (pattern number) #1. As described in conjunction with the first embodiment, the pattern position address which corresponds to the selected block pattern of the stencil mask 55 is supplied to the memory 37A, and thus, the operation coefficients A, B, C, D, $O_x$ and $O_y$ corresponding to the selected block pattern are supplied to the partial irradiation operation circuit 36A and the deflection output values corresponding to the selected block pattern are supplied to the adder 39.

On the other hand, deflection data $(d_x, d_y)$ are stored in the register 38 and supplied to the adder 39 at the time of the electron beam adjustment. However, the register 38 is not used at the time of the exposure. Hence, as in the case of the first embodiment, the second block deflectors 26a through 26d are respectively driven by the output deflection values of the memory 37 via the adder 39 and the AMP/DAC 41 at the time of the exposure.

Next, a description will be given of an embodiment of a charged particle beam exposure method according to the present invention, by referring to FIG. 8. This embodiment of the method carries out the charged particle beam exposure described above with reference to the first embodiment of the apparatus. The processes carried out by this embodiment of the method can basically be divided into an electron beam adjustment routine and an exposure routine as shown in FIG. 8.

In FIG. 8, a step S1 takes the measures described above so that the electron beam reaches the object surface 61 under the condition that the electron beam passes through the center of each electron lens. A step S2 loads the stencil mask 55 into the electron beam exposure apparatus shown in FIG. 6. A step S3 determines the deflection outputs D1, D2, D3, . . . of the second block deflectors 26a through 26d under the condition that each of the block patterns having the pattern numbers #1, #2, #3, . . . are totally irradiated, and stores the deflection outputs D1, D2, D3, . . . at the corresponding addresses of the memory 37. Then, a step S4 obtains the operation coefficients which are required for the calculation in the partial irradiation operation circuit 36 in order to partially irradiate each of the block patterns of the stencil mask 55 at respective positions by deflecting the electron beam by the second block deflectors 26a through 26d, and stores the operation coefficients in the memory within the CPU 31 or the like. Preferably, the operation coefficients are stored in the memory 37A as in the case of the second embodiment of the apparatus at the addresses corresponding to the block patterns so that the operation coefficients may be changed depending on which block pattern is to be partially irradiated by the electron beam. The steps S1 through S4 form the electron beam adjustment routine.

Next, a step S5 outputs an exposure data from the CPU 31. The exposure data includes information indicating which one of the block patterns of the stencil mask 55 is selected and which range (part) of the selected block pattern is to be irradiated by the electron beam to carry out the exposure. A step S6 selects the block pattern of the stencil mask 55 depending on the exposure data and exposes the desired pattern corresponding to the selected pattern on the object surface 61. The steps S5 and S6 form the exposure routine.

In the described embodiments, the present invention is applied to the electron beam exposure. However, the present invention is of course applicable to any type of charged particle beam exposures.

Further, the present invention is not limited to these embodiments, but various variations and modifications may be made without departing from the scope of the present invention.

What is claimed is:

1. A charged particle beam exposure method comprising the steps of:
    (a) selectively irradiating a charged particle beam on at least one selected opening forming a selected pattern of a mask which includes a plurality of openings related to a plurality of kinds of patterns so as to shape a cross section of the charged particle beam which is transmitted through the selected opening, the area of the mask being divided into a plurality of blocks each including at least one opening which is related to one pattern;
    (b) irradiating the charged particle beam which is transmitted through the selected opening of the mask onto an object surface so as to expose a desired pattern corresponding to at least a part of the pattern of the selected opening on the object surface, said step carries out first and second deflections independently of each other with respect to the charged particle beam, said first deflection deflecting the charged particle beam within a first deflection range which corresponds to the size of one block, and said second deflection deflecting the charged particle beam within a second irradiating range which covers a plurality of blocks of the mask, so that the second deflection deflects the charged particle beam to irradiate the selected opening out of the plurality of openings of the mask and the first deflection sets the first deflection range of the charged particle beam with respect to the selected opening, wherein said step (a) independently carries out the first and second deflections using first deflector means provided exclusively for carrying out the first deflection and second deflector means provided exclusively for carrying out the second deflection;

(c) prestoring deflection output values which are to be supplied to the second deflector means when totally irradiating openings of each of the patterns of the mask; and (d) prestoring operation coefficients for each of the patterns of the mask, said step (a) including:

(a1) carrying out an operation to obtain deflection outputs from the first irradiating range of the charged particle beam with respect to the selected opening and the prestored operation coefficients corresponding to the selected opening, and supplying the deflection outputs to the first deflector means to carry out the first deflection; and (a2) supplying the prestored deflection output values corresponding to the selected opening to the second deflector means to carry out the second deflection.

2. The charged particle beam exposure method as claimed in claim 1, wherein said step (d) prestores the operation coefficients so that the first deflection range is continuously variable.

3. The charged particle beam exposure method as claimed in claim 1, wherein the second deflection includes deflecting the charged particle beam back to an original optical axis on which the charged particle beam travels prior to being subjected by the first deflection.

4. The charged particle beam exposure method as claimed in claim 1, wherein said step (a) sets the first deflection range so that the charged particle beam irradiates a part of the selected opening.

5. The charged particle beam exposure method as claimed in claim 1, wherein said step (b) exposes the desired pattern corresponding to the pattern of the selected opening on the object surface by a single shot of the charged particle beam.

6. The charged particle beam exposure method as claimed in claim 1, wherein the first deflection range used by said step (a) is approximately the same as the area of one block containing the selected opening if said step (b) exposes on the object surface the desired pattern which corresponds to the entire pattern of the selected opening.

7. A charged particle bean exposure apparatus for exposing a desired pattern on an object surface by irradiating a charged particle beam on the object surface via at least a selected opening forming a selected pattern of a mask which includes a plurality of openings related to a plurality of kinds of patterns, the area of the mask being divided into a plurality of blocks each including at least one opening which is related to one pattern, said charged particle beam exposure apparatus comprising:

a beam source for emitting a charged particle beam;

first deflector means for carrying out a first deflection by deflecting the charged particle beam on at least a part of the selected opening of the mask within a first deflection range which corresponds to the size of one block based on first data;

second deflector means for carrying out a second deflection by deflecting the charged particle beam on the mask within a second deflection range which covers a plurality of blocks of the mask based on second data;

first means for prestoring second data values which are to be supplied to said second deflector means when totally irradiating openings of each of the patterns of the mask;

second means for prestoring operation coefficients for each of the patterns of the mask; and control means for supplying the first and second data which are related to the selected pattern to said first and second deflector means so that the first and second deflections are carried out independently of each other, said control means including means for carrying out an operation to obtain first data from the first irradiating range of the charged particle beam with respect to the selected opening and the prestored operation coefficients corresponding to the selected opening, and for supplying the deflection outputs to said first deflector means to carry out the first deflection, and means for supplying the prestored second data values corresponding to the selected opening to the second deflector means to carry out the second deflection, wherein said first deflector means is provided exclusively for carrying out the first deflection and said second deflector means is provided exclusively for carrying out the second deflection.

8. The charged particle beam exposure apparatus as claimed in claim 7, wherein said first and second means prestore the second data values and the operation coefficients in a memory for each of the patterns of the mask at the time of a beam adjustment which is carried out prior to actual exposure of the selected pattern.

9. The charged particle beam exposure apparatus as claimed in claim 7, wherein said second means prestores the operation coefficients so that the first deflection range is continuously variable.

10. The charged particle, beam exposure apparatus as claimed in claim 7, wherein the second deflection carried out by said second deflector means includes deflecting the charged particle beam back to an original optical axis on which the charged particle beam travels prior to being subjected by the first deflection which is carried out by said first deflector means.

11. The charged particle beam exposure apparatus as claimed in claim 7, wherein said control means sets the first deflection range so that the charged particle beam irradiates a part of the selected opening.

12. The charged particle beam exposure apparatus as claimed in claim 7, wherein the charged particle beam exposes the desired pattern corresponding to the pattern of the selected opening on the object surface by a single shot of the charged particle beam.

13. The charged particle beam exposure apparatus as claimed in claim 7, wherein the first deflection range used by said first deflector means is approximately the same as the area of one block containing the selected opening if the charged particle beam exposes on the object surface the desired pattern which corresponds to the entire pattern of the selected opening.

14. The charged particle beam exposure apparatus as claimed in claim 7, which further comprises converter means for independently subjecting the first and second data to a digital-to-analog conversion, and said control means supplies the first data to said first deflector means and the second data to said second deflector means respectively via said converter means.

* * * * *